United States Patent
Cripe

[19]

[11] Patent Number: 6,014,025
[45] Date of Patent: Jan. 11, 2000

[54] PWM FLUX-GATE CIRCUIT FOR MEASURING MAGNITUDE AND DIRECTION OF A MAGNETIC FIELD

[75] Inventor: David W. Cripe, Camp Point, Ill.

[73] Assignee: Methode Electronics, Inc., Chicago, Ill.

[21] Appl. No.: 09/028,858

[22] Filed: Feb. 24, 1998

[51] Int. Cl.[7] .......................... G01R 33/02; G01R 33/04
[52] U.S. Cl. .............................................. 324/253; 33/361
[58] Field of Search .................................. 324/253, 254, 324/255; 33/361

[56] References Cited

U.S. PATENT DOCUMENTS 3,605,011  9/1971  Hart et al. .............................. 324/253

*Primary Examiner*—Walter E. Snow
*Attorney, Agent, or Firm*—David L. Newman

[57] ABSTRACT

A Micro-Powered Flux-Gate Magnetometer is provided for measuring the strength and direction of external magnetic fields. The magnetometer includes a saturable core inductor, or flux-gate positioned in an area where the magnetic flux due to external magnetic fields will enter the inductor core and alter the inductance of the coil. The flux-gate inductor is driven by an alternating input signal sufficient to magnetically saturate the inductor core during each cycle. A saturation detecting circuit determines when the flux-gate core reaches saturation, and provides an saturation output signal indicating when, relative to the input signal, the core reaches saturation on each cycle of the input waveform. A comparison circuit compares the saturation signal and the alternating input signal and measures a propagation delay through the flux-gate inductor. Finally, an output circuit provides an analog output voltage signal proportional to the propagation delay through the flux-gate inductor.

22 Claims, 2 Drawing Sheets

NORGATE 116

NORGATE 118

NORGATE 116

NORGATE 118

NORGATE 116

NORGATE 118

PWM FLUX-GATE CIRCUIT FOR MEASURING MAGNITUDE AND DIRECTION OF A MAGNETIC FIELD

BACKGROUND

The present invention relates to a Low Power Flux-gate Magnetometer for measuring the presence of magnetic fields.

Flux-gate Magnetometers are well known in the art. Such devices measure the strength of external magnetic fields by measuring changes in the inductance of a saturable-core inductor, often referred to as a flux-gate. In such devices the flux-gate inductor is driven by an alternating current signal having for example, a sinusoidal or triangular waveform. The AC input current induces an alternating magnetic field within the flux-gate core. The input signal has sufficient amplitude such that the induced current is large enough to drive the flux-gate core into saturation with each cycle of the input waveform. External magnetic fields are detected and measured by measuring changes to the inductance of the flux-gate coil resulting from stray magnetic flux associated with an external magnetic field.

When the flux-gate core becomes magnetically saturated, the magnetic permeability of the core drops toward unity, and the inductance of the flux-gate coil drops to only a fraction of its original value. The rapid decrease in inductance causes a corresponding drop in voltage as measured across the flux-gate inductor. Thus, by monitoring the voltage signal across the flux-gate inductor, the point in time when the magnetic flux-density within the flux-gate core reaches saturation can be determined in relation to the alternating cycle of the input waveform.

The magnetic flux density within the flux-gate core is a function of both the induced current flowing through the flux gate inductor and any stray magnetic flux associated with the presence of an external magnetic field. Since the external magnetic field component is variable, the saturation current $I_{SAT}$ necessary to drive the flux-gate core into saturation will vary depending on the strength and direction of the external magnetic field. Also, since the voltage waveform across the flux-gate inductor collapses when the flux-gate core reaches saturation, the actual saturation current, $I_{SAT}$, which drives the flux-gate core into saturation can be determined by comparing the output voltage waveform to the input current waveform, and measuring the delay between the rise in the input current waveform and the collapse of the output voltage waveform. Based on these measured changes in the saturation current, the magnitude and direction of the external magnetic field can be derived.

Prior art flux-gate magnetometers are constant amplitude, alternating current devices. In other words, current is flowing through the flux-gate inductor throughout each cycle of the input voltage waveform. As noted, the magnitude of the saturation current is derived by monitoring the timing of the collapse of the voltage waveform across the flux-gate inductor as the flux-gate core reaches saturation. In the past this has typically been accomplished by placing a resistor in series with the flux-gate input, and grounding the flux-gate output. The series resistance is selected to be many times larger than the reactance of the flux-gate inductor such that when the circuit is fed by a voltage waveform, the current through the circuit is determined mainly by the resistor rather than the inductance of the flux-gate coil. The input to the flux-gate coil is also connected to one input of a voltage comparator which monitors the voltage across the flux-gate inductor. In this arrangement, alternating current continually flows through the resistor and flux-gate combination, and therefore, power is continually dissipated across the resistor.

The voltage across the flux-gate inductor generally follows the inductor current signal, but is advanced by 90°. In general, the magnetometer circuit is driven by a sinusoidal waveform having sufficient amplitude to drive the flux-gate coil into saturation during each half cycle. As already noted, when the current through the flux-gate reaches saturation, the inductance of the coil drops drastically such that the voltage across the flux gate drops to approximately 0V while the flux-gate core remains saturated. The voltage across the flux-gate will remain approximately equal to zero as long as the flux-gate core remains saturated. However, since the flux gate is not a perfect inductor, parasitic resistance and inductance within the coil will cause the flux-gate voltage to have a slight slope while the flux-gate core is saturated, and a definite zero crossing can be ascertained. This zero crossing is detected by the comparator connected to the input of the flux-gate. From the timing of the zero crossings relative to the input signal, the magnitude of the saturation current can be ascertained. Additional circuitry compares the output of the comparator against the input voltage waveform to determine the relationship between the zero crossings and the input voltage signal. Since variations in the external magnetic field will alter the saturation current, the collapse in the voltage waveform, and thus the zero crossings detected by the comparator, will occur at different times relative to the input waveform, depending on the magnitude and direction of the external field. By comparing the comparator output signal against the input signal, the magnitude and direction of the external magnetic field can be derived.

As described, prior art flux-gate magnetometers provide an extremely linear, accurate and noise immune measure of magnetic fields. The operating characteristics of flux-gate magnetometers are very favorable, especially when compared to Hall effect and magnetoresistive devices. However, a significant drawback to such devices is their relatively large power consumption. Since the magnetometer is a constant current device, power is continually dissipated by the device. Furthermore, the current supplied to device must be sufficient to saturate the flux-gate core, typically this is on the order of tens of milliamps. This can be a significant drawback for some applications where low power consumption is a significant design criterion. For example, in applications where the magnetometer is to be battery powered, the current consumption of the device must be kept to a minimum in order to conserve battery life. Therefore, it is desirable to provide a magnetometer having the positive characteristics of traditional flux-gate magnetometers, including linearity, accuracy and noise immunity, while simultaneously drawing only a negligible amount of current.

SUMMARY OF THE INVENTION

In light of the background given above, a primary object of the present invention is to provide an efficient, accurate, low noise magnetometer for detecting and measuring external magnetic fields.

Another object of the present invention is to provide a magnetometer having a saturable core flux-gate inductor, wherein the strength and direction of external magnetic fields can be measured by monitoring changes in the inductance of the saturable core flux-gate inductor.

An additional object of the present invention is to provide a flux-gate magnetometer wherein the flux-gate inductor is driven by a relatively low frequency AC voltage signal.

Yet another object of the present invention is to provide a magnetometer which consumes only a fraction of the power consumed by traditional flux-gate magnetometers.

Still another object of the present invention is to provide a flux-gate magnetometer wherein the current drawn by the device can be less than 10 $\mu$A when driven by a 5V signal.

These objects, as well as others which will become apparent upon reading the detailed description of the preferred embodiment, are met by the Micro-Powered Flux-Gate Magnetometer herein disclosed.

The Flux-Gate Magnetometer of the present invention measures external magnetic fields by measuring changes in the inductance of the flux-gate coil caused by the presence of magnetic flux associated with the external magnetic field. The flux-gate comprises a saturable core inductor driven by a nominal 100 Hz square wave voltage signal. The input square wave generates a sinusoidal current signal through the flux-gate coil having an amplitude sufficient to magnetically saturate the flux-gate core with each cycle of the input signal. A capacitor is connected between the flux-gate output and ground. The current flowing through the flux-gate sinusoidally charges and discharges the capacitor with each cycle of the input waveform, and a voltage comparator generates an output signal based on the voltage across the capacitor. In the preferred embodiment, the comparator is configured as a logic gate which changes state when the voltage across the capacitor reaches ½ the amplitude of the input voltage signal.

The output signal from the comparator is related to the input signal, but the timing of the rising and falling edges of the output voltage signal are altered due to the inductance of the flux-gate coil. With no external magnetic field present, the propagation delay through the flux-gate coil will be the same for both the rising and falling edges of the input signal. However, when an external magnetic field is present, the propagation delay will be different for the rising edges of the signal as compared to the falling edges.

Logic circuitry is provided to compare the comparator output signal to the input voltage signal and measure the propagation delay for both the rising and falling edges of the comparator output signal. The logic circuitry generates two pulse width modulated (PWM) signals. The pulse width of the first PWM signal pulses corresponds to the rising edge propagation delay, and the pulse width of the second PWM signal pulses corresponds to the falling edge propagation delay.

Pulse width demodulating circuitry is provided to measure the difference in pulse width between the rising edge and falling edge signals. The demodulation circuitry generates an analog voltage signal which corresponds to the difference in pulse width of the two signals. Since the relative pulse width between the two signals is proportional to the strength and direction of the external magnetic field, the analog signal generated by the demodulation circuitry will be directly proportional to the external magnetic field.

The magnetometer of the present invention draws much less current than traditional flux-gate magnetometers. Current consumption is reduced due to the arrangement of the flux-gate inductor and the capacitor. On the rising edge of the input voltage signal, the current through the flux-gate begins charging the capacitor toward the maximum voltage of the input signal, $V_{DD}$. When the flux-gate core reaches saturation, the inductance of the flux-gate drops to a fraction of its original value, and the drop in inductance results in a current spike through the flux-gate. This current spike rapidly charges the capacitor to $V_{DD}$. At this point in the input voltage cycle, current will no longer flow from $V_{DD}$, as the rise in capacitor voltage is clamped by a Schottky diode connected between the flux gate output and $V_{DD}$. This diode returns the flux-gate current to $V_{DD}$ until the flux-gate current decays to zero. The energy in the flux gate inductor results in current flow from Vdd, through the driving circuit, through the flux-gate inductor, through the Schottky diode, back to Vdd. No current is drawn from Vdd; no power is consumed from the Vdd voltage source. The LC time constant is much shorter than one half cycle of the 100 Hz input voltage signal. Thus, the flux-gate consumes no current through the major portion of the positive half cycle of the input waveform. During the negative half cycle, the capacitor discharges through the flux gate inductor, so that no additional current is being drawn from the input circuitry. This drastically reduces the power consumed by the magnetometer. Thus, the present invention is well suited for applications requiring a battery or photovoltaic power source. The invention is also particularly well suited to magnetostrictive torque sensing applications where Hall effect sensors have traditionally been used. In such applications the invention is ideal for portable consumer products which require torque sensing or any other portable device in which it is necessary to sense the presence of magnetic fields.

BRIEF DESCRIPTION OF THE DRAWINGS

FIG. 2 shows pulse width modulated output signals from NOR gates 116, 118 depicted in FIG. 1;

DETAILED DESCRIPTION OF THE PREFERRED EMBODIMENT

The present invention relates to a flux-gate magnetometer, and more particularly to a flux-gate Magnetometer which consumes a negligible amount of power.

Figure 1:
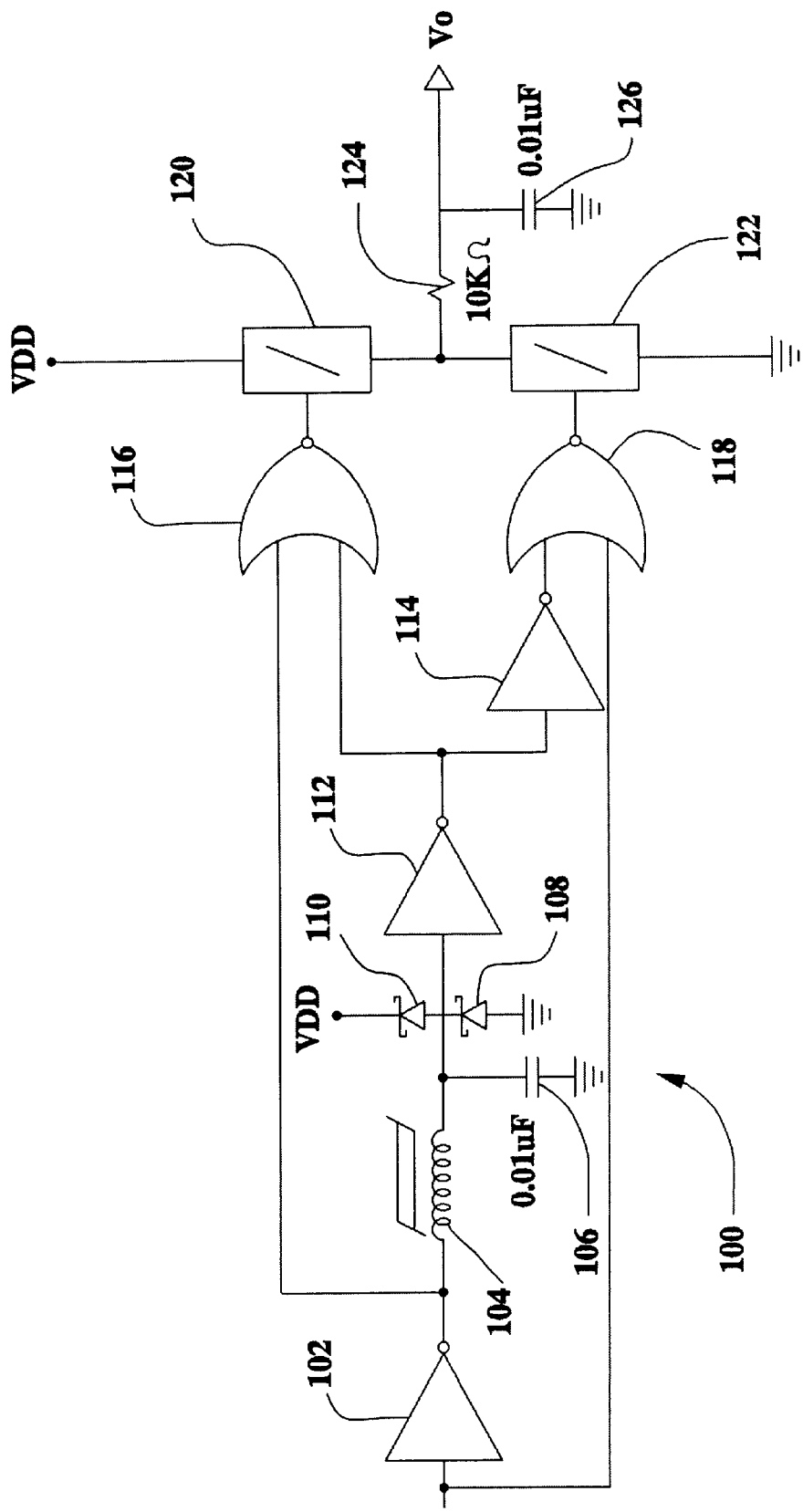
FIG. 1 is a schematic diagram of a Micro-Power Magnetometer circuitry according to the preferred embodiment of the present invention.

Referring to the FIG. 1, Micro-Power Flux-Gate Magnetometer circuitry is shown 100. The significant elements of magnetometer circuit 100 include an inverting input buffer 102; a saturable core inductor, or flux-gate 104; a first 0.01 $\mu$F capacitor 106; first and second Schottky diodes 108, 110; inverting output buffer 112; second output inverter 114, first and second NOR gates 116, 118; first and second analog switches 120, 122; a 10 K$\Omega$ resistor 124; and a second 0.01 $\mu$F capacitor 126.

Physically, the flux-gate inductor 104 is positioned near the point where external magnetic fields are to be measured. The flux-gate coil 104 is oriented such that the magnetic flux associated with the external magnetic field will interact with the flux-gate inductor's saturable core. The input to the magnetometer circuit 100 is excited by a nominal 100 Hz square wave voltage signal which drives both the inverting input buffer 102, and one input of the second NOR gate 118. Input buffer 102 inverts the input voltage signal, and isolates the flux-gate circuitry. The output of buffer 102 drives the flux-gate inductor 104 and one input of the first NOR gate 116, and the output of flux-gate inductor 104 drives inverting output buffer 112. First 0.01 $\mu$F capacitor 106 is connected between the output of flux-gate inductor 104 and ground.

Similarly, first Schottky diode 108 is also connected between the flux-gate inductor 104 output and ground, while second Schottky diode 110 is connected between the DC supply voltage $V_{DD}$ and the output of flux-gate inductor 104. The output of the inverting output buffer 112 drives second output inverter 114, as well as the second input to first NOR gate 116. The output of second output inverter 114 drives the second input of second NOR gate 118. Finally, the output of first NOR gate 116 drives the first analog switch 120, and the output of the second NOR gate 118 drives the second analog switch 122.

The two analog switches 120, 122 are configured to operate as a tri-state switch. The first analog switch 120 is referenced to the supply voltage $V_{DD}$, and second analog switch 122 is referenced to ground. The outputs of the two analog switches 120, 122, are connected to one another and input to a low pass filter comprising 10 KΩ resistor 124 and the second 0.01 μF capacitor 126. The output of the filter network provides an analog voltage signal $V_O$ that is proportional to the strength of the external magnetic field in which the flux-gate inductor 104 is immersed.

In operation, the inverted voltage signal output from inverting input buffer 102 drives the flux-gate inductor 104. This symmetrical square wave voltage signal alternates between 0V and the supply voltage $V_{DD}$. Flux-gate inductor 104 is constructed with a magnetically saturable core. The square wave voltage signal input to the flux-gate induces a sinusoidal current through the flux-gate inductor 104 sufficient to saturate the core. The threshold saturation current $I_{SAT}$ which saturates the flux-gate core is determined by the physical construction of the flux-gate inductor, and is affected by the presence of additional magnetic flux associated with an external magnetic field in the vicinity of the flux-gate coil.

As the input voltage signal transitions from 0V to $V_{DD}$, the current through the flux-gate inductor and capacitor increases in a sinusoidal manner typical of LC circuits. As the current through the flux-gate inductor 104 increases, the magnetic flux density within the core increases as well. As the magnetic flux density within the core exceeds the saturation flux-density, the relative permeability of the core drops toward unity, causing a corresponding drop in the inductance of the flux-gate coil. While the core is saturated, the inductance of the flux-gate coil remains only a fraction of its non-saturated value. With this drop in inductance the rate of change in the current through the flux-gate increases radically, causing a current spike through the flux-gate 104.

When the voltage signal input to the flux-gate 104 transitions from 0V to $V_{DD}$, the current through the flux-gate charges 106. When the magnetic flux-density within the flux-gate core reaches saturation, the corresponding spike in the output current of flux-gate 104 rapidly charges capacitor 106 to $V_{DD}$. Inverting output buffer 112 connected to the output of flux-gate 104 and capacitor 106 operates as a comparator monitoring the voltage across capacitor 106. The output of inverting output buffer 112 will be set to logic $1(V_{DD})$ when the voltage across capacitor 105 is less than $½V_{DD}$. Conversely, the output of inverting output buffer 112 will be set to logic 0 (0.0V) when the voltage on capacitor 106 is greater than $½V_{DD}$. Schottky diodes 108, 110 are added to the output of flux-gate 104 to protect the input of inverting output buffer 112 from resonant excursions of the LC combination of flux-gate inductor 104 and capacitor 106.

From what has been described, it is clear that as the voltage signal input to flux-gate inductor 104 transitions from 0V to $V_{DD}$, capacitor 106 will begin resonantly charging from 0.0V toward $V_{DD}$. The rate at which capacitor 106 begins charging will be dependent on the inductance of the flux-gate coil 104. While the voltage across capacitor 106 is less than $½V_{DD}$, the output of inverting output buffer 112 is set to logic 1, or $V_{DD}$. As the core of flux-gate inductor 104 reaches saturation, the corresponding output current spike rapidly charges capacitor 106 to $V_{DD}$, surpassing the $½V_{DD}$ threshold of inverting output buffer 112. Thus, when the core reaches saturation, the output of buffer 112 drops to logic 0 nearly instantaneously. This transition, however, lags the positive transition of the input signal by a measurable time delay. The length of this delay is a function of the inductance of the flux-gate coil 104 and the flux density of any external magnetic fields which may be interacting with the flux-gate core.

A similar phenomenon occurs as the voltage signal input to flux-gate 104 transitions from $V_{DD}$ to 0.0V. On the positive half cycle, capacitor 106 charges to $V_{DD}$ matching the voltage of the input signal. Once the voltage on capacitor 106 reaches $V_{DD}$, no current flows through flux-gate inductor 104 for the remainder of the positive pulse. When the input signal transitions from $V_{DD}$ to 0.0 V, however, the voltage on the output side of flux-gate 104 will be greater than the 0.0V applied to the input side. As with the forward current charging capacitor 106, the reverse discharge current flowing through flux-gate inductor 104 reaches saturation in the opposite direction. Again, the inductance of the coil drops sharply, causing a reverse current spike through flux-gate 104. This reverse current spike rapidly discharges capacitor 106, pulling the voltage across capacitor 106 down to 0.0V almost immediately. As the voltage on capacitor 106 drops past the ½ $V_{DD}$ threshold, the output of inverting output buffer 112 transitions forms logic 0 to logic 1, or $V_{DD}$. Capacitor 106 is sized such that during the discharge cycle, the saturation current $I_{SAT}$ occurs when the voltage across capacitor 106 is approximately equal to $½V_{DD}$. As with the leading edge of the positive half cycle, the delay between the input signal transition from $V_{DD}$ to 0.0V and the transition of output of buffer 112 from logic 0 to logic 1 will be dependent on the inductance of flux-gate coil 104, and will be affected by the presence of external magnetic fields.

As noted, the output of inverting output buffer 112 is connected directly to one input of NOR gate 116, and the inverted input waveform driving flux-gate 104 is connected to the other. This combination results in a series of logic pulses corresponding to the rising edge of each pulse of the input waveform. The width of each pulse output from NOR gate 116 corresponds to the time delay between the rising edge of each input pulse and the positive transition from 0.0V to $V_{DD}$ of output buffer 112.

In addition to one input of NOR gate 116, output buffer 112 also drives second output inverter 114. Inverter 114 applies the inverted output of buffer 112 to one input of the second NOR gate 118. The non-inverted square wave signal input to the magnetometer circuitry 100 is applied to the other input of NOR gate 118. NOR gate 118 outputs a train of pulses corresponding to the falling edge of the input square wave pulses. The width of each pulse output from NOR gate 118 corresponds to the time delay between the falling edge of each pulse of the input waveform and the falling edge of the output waveform of output buffer 112. Thus, the width of the pulses output from NOR gates 116, 118 corresponds to the propagation delay of both the rising and falling edges of the input square wave signal through flux-gate inductor 104.

Under ambient conditions, when no external magnetic fields are present, the saturation current $I_{SAT}$ required to magnetically saturate the core of flux-gate 104 will be equal in both the forward and reverse directions. Thus, the inductance, and therefore the propagation delay through the flux-gate 104, will be the same for both the rising and falling edges of the input voltage signal. This is manifest in the pulse trains output from NOR gates 116, 118. With no external magnetic fields interacting with the flux-gate core 104, the pulse width of each pulse output from NOR gate 116 will equal the pulse width of the pulses output from NOR gate 118. This symmetry does not hold, however, once an external magnetic field is introduced.

With each half cycle of the input voltage square wave, the voltage polarity across flux-gate inductor 104 is reversed. Thus, the current through the flux-gate, as well as the magnetic flux within the flux-gate core, reverses with each half cycle of the input voltage signal. When an external magnetic field is introduced, the magnetic flux associated with the external magnetic field will add to the induced magnetic flux during one half cycle of the input wave form, and subtract from the induced flux during the opposite half cycle. This interaction with the induced magnetic field changes the saturation current $I_{SAT}$ necessary to drive the flux-gate coil into saturation. However, due to the directional nature of the external magnetic field, the changes to $I_{SAT}$ are different in the forward and reverse directions across the flux-gate inductor 104. For example, if the external field is parallel to the direction of the magnetic flux induced in the flux-gate core during the positive half cycle of the input waveform, the flux-gate core will reach saturation sooner than is the case when no external field is present. This leads to a reduction in the saturation current in the forward direction. Conversely, in the reverse direction, a greater reverse current is necessary to overcome the opposing magnetic flux of the external field. This leads to an increase in the saturation current in the reverse direction.

The changes in the forward and reverse saturation currents affect the propagation delay through the flux-gate. Since the square wave signal input to the magnetometer circuit 100 is inverted prior to being input to the flux-gate, a forward current is induced within the flux-gate inductor during the negative half cycle of the input wave form. Thus, capacitor 106 begins charging when the input signal transitions from $V_{DD}$ to 0V. In the example described above, the external magnetic field is oriented such that the forward saturation current is lowered. This means that the flux-gate core will reach saturation sooner in the input voltage cycle than it otherwise would under ambient conditions, thus causing the voltage across capacitor 106 to cross the ½ $V_{DD}$ threshold sooner as well. Ultimately, the negative transition of the input signal is registered at the output of output buffer 112 sooner than it otherwise would under ambient conditions. Simply put, the forward propagation delay is reduced.

Conversely, a reverse current is induced in the flux-gate 104 during the positive half cycle of the input waveform. Capacitor 106 begins discharging when the input signal transitions from 0V to $V_{DD}$. Since the external magnetic field has the affect of raising the reverse saturation current, the flux-gate core will not become saturated until later in the positive half cycle of the input waveform than it otherwise would. Thus, the voltage across capacitor 106 drops below the ½ $V_{DD}$ threshold later in the cycle than it does under ambient conditions. Therefore, the positive transition of the input signal is registered at the output of output buffer 112 later as well. In other words, the reverse propagation delay is increased.

If the direction of the external field is reversed, the changes to the forward and reverse propagation delays resulting from the magnetic field are reversed as well. In other words the forward delay will be increased and the reverse delay will be reduced.

Figure 2A:
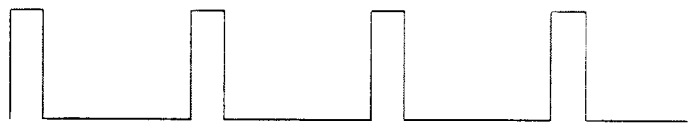
FIG. 2a shows the two signals when no external magnetic field is present.
Figure 2A:
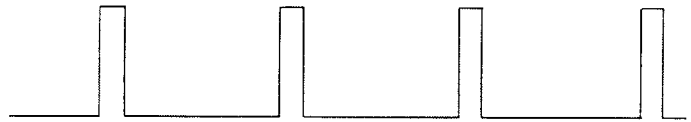
Figure 2B:
FIG. 2b shows the two signals when an external magnetic field is present and oriented in a first direction.
Figure 2B:
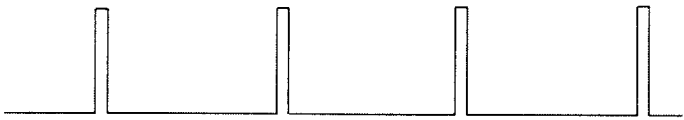
Figure 2C:
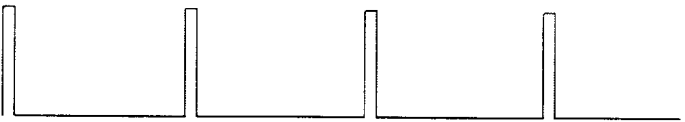
FIG. 2c show the two signals when an external magnetic field is present and oriented in a second direction 180° opposite the orientation of the field in FIG. 2b.
Figure 2C:
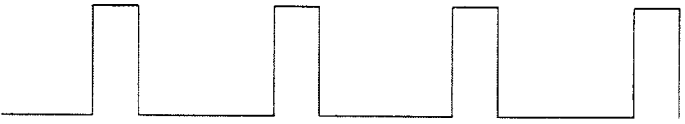

As previously noted, these changes in the forward and reverse propagation delays alter the pulse width of the two pulse trains output from NOR gates 116, 118. In FIG. 2 output pulse trains for NOR gates 116, 118 are shown for various conditions. FIG. 2a shows the output pulse trains under ambient conditions where there is no external magnetic field interacting with flux-gate 104. FIG. 2b shows the same output pulse trains when an external magnetic field is present. In FIG. 2b the external field is oriented in a direction where the external flux density is additive to the induced flux density when the inductor current is flowing in the positive direction. Finally, FIG. 2c shows the output pulse trains when the external magnetic field is oriented such that the external flux density is additive to the induced flux density when the inductor current is flowing in the reverse direction.

As can be seen, under the ambient conditions of FIG. 2a, the pulses output from NOR gates 116 and 118 are of equal width. In FIG. 2b, however, the forward propagation delay is reduced and the reverse propagation delay is increased. Therefore, the pulse width of the pulse train output from NOR gate 118 is much narrower than the pulse width of the pulse train output from NOR gate 116. Similarly, FIG. 2c shows the opposite condition where the external magnetic field is oriented in the opposite direction as in FIG. 2b. In FIG. 2c the forward propagation delay is increased and the reverse propagation delay is reduced. In this case, the pulse width of the output pulses from NOR gate 116 is much narrower than the wider output pulses from NOR gate 118. The outputs of NOR gates 116, 118 are in effect pulse width modulated signals where the pulse width of the two signals is determined by the strength and direction of the external magnetic field.

The magnetometer of the present invention measures the external magnetic field by demodulating the signals output from NOR gates 116, 118 and generating an analog voltage signal proportional to the difference in the pulse width of the two signals. The preferred method for demodulating these signals includes analog switches 120, 122, and the low pass filter comprising the 10 kΩ resistor 124 and the 0.01 μF capacitor 126. The output of NOR gate 116 is input to analog switch 120, and the output of NOR gate 122 is input to analog switch 122. Switch 120 is referenced to the supply voltage $V_{DD}$, and switch 122 is referenced to ground. The outputs of the two switches are connected together and input to the low pass filter. In this configuration, the two analog switches 120, 122, act as a tri-state switch. When the input to switch 120 is high, switch 120 becomes conductive, and $V_{DD}$ is input to the low pass filter. When the input to switch 122 is high, switch 122 becomes conductive, and ground potential is applied to the filter. Otherwise the analog switches 120, 122 are non-conductive. Since the pulses output from NOR gate 116 correspond to the leading edge of the input squarewave pulses, and the pulses output from NOR gate 118 correspond to the trailing edge of the input squarewave pulses, the inputs to switches 120, 122 will alternate with each cycle of the input wave form. Thus, the input to the low pass filter will alternately be connected first to $V_{DD}$, then to ground with each pulse of the input waveform. During the intervals when switch 120 is conductive, capacitor 126 will begin charging toward $V_{DD}$. Similarly, during the intervals when switch 122 is conductive, capacitor 126 will begin discharging toward ground. Capacitor 126 and resistor 124 are sized such that the RC time constant of the filter is much greater than the duration of the pulses output from NOR gates 116, 118. Therefore, the amount of charging and discharging of capacitor 126 which occurs while either switch is conductive is very small.

Under ambient conditions the width of the input pulses to both switches 120, 122 will have the same duration. Thus, with each cycle, switch 120 will be conductive for the same length of time as switch 122, and therefore, capacitor 126 will be charging toward $V_{DD}$ for the same length of time as it is discharging toward ground. The result is a an average voltage across capacitor 126 equal to ½ $V_{DD}$.

When a magnetic field is present, the pulses output from NOR gates 120, 122 are no longer symmetric. With the external magnetic field oriented in a first direction, the pulses output from NOR gate 116 are of greater duration than those output from NOR gate 118. During each cycle of the input waveform, analog switch 120 is conductive for a longer duration than switch 122. This means that capacitor 126 spends slightly more time charging than discharging during each cycle of the input waveform. This results in an average voltage drop across capacitor 126 greater than ½ $V_{DD}$. If the external magnetic field is oriented in a second direction, 180° opposite the first direction, the output pulses from NOR gate 118 will be of greater duration than those output form NOR gate 116. Therefore, analog switch 122 is conductive for a longer duration than analog switch 120. This means that capacitor 126 spends slightly more time discharging than charging during each cycle of the input waveform. This results in an average voltage drop across capacitor 126 of less than ½ $V_{DD}$.

As the external field becomes stronger in either direction, one or the other of the analog switches 120, 122 will be conductive for a greater and greater amount of time relative to the other analog switch. Thus, the output voltage signal developed across capacitor 126 will be driven up toward $V_{DD}$, or down toward ground. The result is an analog voltage signal proportional to the strength and direction of the external magnetic field. This analog signal can be used to drive a conventional volt meter, or some other device, to provide a measure of the external magnetic field.

The circuit shown in FIG. 1 consumes only a fraction of the power consumed by prior art flux-gate magnetometers. The sensing portion of the circuit, for example, comprising the flux-gate coil 104 and capacitor 106, can be designed specifically for low power consumption. When driven by an alternating signal having a frequency f and an amplitude equal to $V_{DD}$, it can be shown that the circuit consumes an amount of power equal to $½V_{DD}^2*0.01$ $\mu F*f$. Thus, the amount of power consumed can be minimized by reducing the clock rate of the input waveform and by reducing the value of $V_{DD}$ and by reducing the capacitance of capacitor 106. However, it is also necessary to size capacitor 106 such that during the resonant LC cycle, the current through the flux-gate coil 104 reaches the saturation current $I_{SAT}$ when the voltage across capacitor 106 is approximately equal to ½$V_{DD}$. This can be accomplished by setting the capacitance of capacitor 106 approximately equal to $I_{SAT}L/V_{DD}^2$. Therefore, with the size of capacitor 106 so constrained, the options for reducing the power consumption of the circuit are reduced to changing the frequency of the input waveform. In the preferred embodiment capacitor 106=0.0 $\mu F$, $V_{DD}$=5V and the input frequency=100 Hz. Such a circuit was built and tested and resulted in a current draw of 7 $\mu A$. With the clock frequency further reduced to 50 Hz and the amplitude of the input signal reduced to 3 V, the current drop was reduced even further, to 5 $\mu A$. Such a low current draw makes the circuit particularly well suited for those applications requiring a low power magnetometer such as those applications operating from a battery or photovoltaic power source.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A magnetometer, comprising:
   a magnetic field sensor, responsive to a first alternating voltage signal and an external magnetic field incident upon said magnetic sensor, for providing a field sensor output signal; and
   a pulse width modulator circuit, responsive to the field sensor output signal, for providing a first pulse width modulated signal corresponding to a propagation delay of the rising edge of the first alternating voltage signal through the sensor, and a second pulse width modulated signal corresponding to a propagation delay of the falling edge of the first alternating voltage signal through the sensor; and
   a pulse width demodulator circuit, responsive to said first and second pulse width modulated signals, for demodulating them and providing a signal indicative of the magnitude and direction of said external magnetic field.

2. The magnetometer of claim 1, wherein the magnetic field sensor comprises a saturable core flux-gate inductor driven by said first alternating voltage signal.

3. The magnetometer of claim 2 wherein the magnetic field sensor further comprises a capacitor connected to the output of the flux-gate inductor, the capacitor storing a second alternating voltage signal output from the flux-gate.

4. The magnetometer of claim 3 wherein the capacitor and the flux-gate inductor define a resonant frequency, and wherein the first alternating voltage signal has a signal frequency much lower than the resonant frequency defined by the capacitor and flux-gate inductor.

5. The magnetometer of claim 4, wherein the magnetic field sensor further comprises a comparator responsive to the second alternating voltage signal, for generating a logic output signal which changes state in response to the second alternating voltage signal crossing a predetermined voltage threshold.

6. The magnetometer of claim 5 wherein the comparator comprises a first logical inverter.

7. The magnetometer of claim 2 wherein the pulse width modulator circuit comprises a NOR logic gate, having a first input driven by the first alternating voltage signal, and a second input driven by the field sensor output signal.

8. The magnetometer of claim 2, wherein the pulse width modulator further comprises a first logical inverter connected to the magnetic field sensor output signal for providing an inverted field sensor output signal, the pulse width modulator circuit for further providing a second pulse width modulated signal responsive to the inverted field sensor output signal.

9. The magnetometer of claim 8, wherein the pulse width modulator further comprises:
   a second logical inverter connected to the first alternating voltage signal driving the flux-gate inductor, for providing an inverted first alternating voltage signal;
   a first NOR logic gate driven by the first alternating voltage signal and the field sensor output signal, for providing the first pulse width modulated signal; and a second NOR logic gate driven by the inverted first alternating voltage signal and the inverted field sensor output signal, for providing the second pulse width modulated signal.

10. The magnetometer of claim 2 wherein the pulse width demodulator circuit comprises a tri-state switch and an RC filter.

11. The magnetometer of claim 10 wherein the tri-state switch comprises:

a first analog switch referenced to a first voltage reference and activated by the first pulse width modulated signal;

a second analog switch referenced to a second voltage reference and activated by the second pulse width modulated signal; and the first and second analog switches each having an output signal connected to the input of the RC filter.

12. A Micro-Powered Flux-Gate Magnetometer for measuring the strength and direction of external magnetic fields, comprising:

a saturable core inductor responsive to an external magnetic field and an alternating input signal for magnetically saturating the inductor core;

a saturation detecting circuit for providing a saturation signal indicative of the time between application of the input signal to the core and the time at which the inductor core becomes saturated;

a comparison circuit for comparing the saturation signal with the alternating input signal and measuring a propagation delay between alternating pulses of the input signal and the subsequent saturation of the inductor coil for each of the rising and falling edges of the alternating input signal pulses; and an output circuit for providing an analog output signal in response to the propagation delay for indicating the strength and direction of the magnetic field.

13. The magnetometer of claim 12 wherein the saturation detecting circuit comprises:

a capacitor connected between the inductor output and a ground reference; and a comparator configured to monitor a voltage drop across the capacitor, the comparator generating a logic output signal transitioning between a true and false state when the voltage drop across the capacitor crosses a threshold voltage equal to approximately one half the amplitude of the alternating input signal.

14. The magnetometer of claim 13 wherein the comparison circuit comprises a first pulse width modulator providing a first PWM signal having a pulse width equal to a first signal propagation delay through the inductor, the first propagation delay being equal to the delay between a first transition of the input signal, and a subsequent opposite transition of the comparator logic output signal.

15. The magnetometer of claim 14 wherein the output circuit comprises a pulse width demodulator wherein the analog output signal is proportional to the pulse width of the first PWM signal.

16. The magnetometer of claim 14 wherein the comparison circuit further comprises a second pulse width modulator providing a second PWM signal having a pulse width equal to a second signal propagation delay through the inductor, the second propagation delay being equal to the delay between a second opposite transition of the input signal, and a subsequent transition of the comparator logic output signal.

17. The magnetometer of claim 16 wherein the output circuit comprises a tri-state switch coupled to an RC filter.

18. The magnetometer of claim 16 wherein the tri-state switch comprises:

a first analog switch referenced to a first output voltage reference, the first analog switch connecting the first output voltage reference to the input of the RC filter when the first PWM signal is in a logic true state; and a second analog switch referenced to a second output voltage reference, the second analog switch connecting the second output voltage reference to the input of the RC filter when the second PWM signal is in a logic true state.

19. A magnetometer, comprising:

a flux-gate inductor;

an oscillator for driving the flux-gate inductor with an alternating input voltage signal;

voltage storage means for storing an output voltage signal from the flux gate inductor;

comparison means for comparing the output voltage signal stored in the voltage storage means against the input voltage signal, the comparison means detecting a signal propagation delay through the flux-gate and generating a pulse width modulated signal modulated by the propagation delay for each of the rising and falling edges of each pulse of the input voltage signal through the flux-gate inductor; and pulse width demodulator means for generating an analog voltage signal in response to the pulse width modulated signal generated by the comparison means, for in turn, indicating the strength and direction of the magnetic field.

20. The magnetometer of claim 19 wherein the voltage storage means comprises a capacitor connected between an output of the flux gate inductor and a ground reference potential.

21. The magnetometer of claim 20 wherein the alternating input voltage signal comprises alternate rising and falling edges, and said comparison means comprises a first pulse width modulator whereby a first pulse width modulated signal is modulated by a first propagation delay corresponding to the time delay between a rising edge of the input signal and the voltage stored in the capacitor reaching a predetermined voltage level.

22. The magnetometer of claim 21 wherein the comparison means further comprises a second pulse width modulator generating a second pulse width modulated signal, whereby the pulse width of the second modulated signal is modulated by a second propagation delay corresponding to the time delay between a falling edge of the input voltage signal and the voltage drop across the capacitor dropping below a predetermined voltage level.

* * * * *